United States Patent
Anand et al.

(10) Patent No.: US 6,927,562 B2
(45) Date of Patent: Aug. 9, 2005

(54) POWER FACTOR/TAN δ TESTING OF HIGH VOLTAGE BUSHINGS ON POWER TRANSFORMERS, CURRENT TRANSFORMERS, AND CIRCUIT BREAKERS

(75) Inventors: Ramesh Anand, North Wales, PA (US); Jeffrey D. Benach, Honey Brook, PA (US); Emidio Cimini, Chalfont, PA (US); Jan C. Heyneke, Exton, PA (US)

(73) Assignee: On-Line Monitoring, Inc., Honeybrook, PA (US)

( * ) Notice: Subject to any disclaimer, the term of this patent is extended or adjusted under 35 U.S.C. 154(b) by 236 days.

(21) Appl. No.: 10/171,263

(22) Filed: Jun. 13, 2002

(65) Prior Publication Data

US 2003/0160602 A1 Aug. 28, 2003

Related U.S. Application Data

(60) Provisional application No. 60/359,908, filed on Feb. 27, 2002.

(51) Int. Cl.$^7$ ................................................. G01R 1/02
(52) U.S. Cl. ...................................... 324/126; 324/551
(58) Field of Search ................................ 324/126, 124, 324/552, 551; 340/870.16

(56) References Cited

U.S. PATENT DOCUMENTS 4,419,619 A * 12/1983 Jindrick et al. ............. 323/257
4,757,263 A * 7/1988 Cummings et al. ......... 324/552

(Continued)

FOREIGN PATENT DOCUMENTS

JP 09182294 A * 7/1997 ............. H02J/3/18

OTHER PUBLICATIONS

CEI/IEC 61010–1 (second edition 2001–2), pp. 1,3,5–6,9, 19,39,43,45,61,65,67.*

Primary Examiner—Charles H. Nolan, Jr.
(74) Attorney, Agent, or Firm—Dann, Dorfman, Herrell and Skillman, P.C.

(57) ABSTRACT

Measurement of power factor to diagnose the condition of high powered stand-off insulators, which include a roll of insulating material carrying an intermediate layer of conductor between layers of the insulating material around a central HV conductor in a hollow insulator body, is accomplished while the power system is subject to full voltage. Coupling means provides a capacitive voltage divider with a tap at a low voltage point on the conductor within the insulator structure. The divider with the coupling means is also provided with an external low voltage connector and a ground connector. A computer is connected to the external connections of the coupling means and contains software to convert a received analog signal to digital, and subject the digital signal to a fast Fourier transform analysis to produce an output signal representative of the power factor. The computer is arranged to calculate, process and store the bushing insulator power factor at periodic intervals. The invention also involves a method of measuring power factor in an insulation structure as described and then involving disconnecting high power from the HP equipment. A connection is made from a conductive capacitive layer at the low voltage end of the insulation roll in the bushing to a capacitive voltage divider in a bushing tap coupler to provide an output from the coupler on the order of household voltage when HV is reconnected to the equipment. Low voltage from the coupler to a further voltage divider circuit further reduces the voltage at the output to a level acceptable to a computer. The high power is then reconnected to the equipment so the computer voltage is available on demand at the output of the measuring equipment. The invention also provides a method of testing HV insulators as described by providing low voltage output across a passage divider from a tap to the conductive capacitive layer at the low voltage end of the conductor within the insulation roll within the bushing. The bushing tap coupler is connected to a voltage reduction circuit to reduce voltage to a level acceptable to a computer.

10 Claims, 2 Drawing Sheets

U.S. PATENT DOCUMENTS

Figure 1:
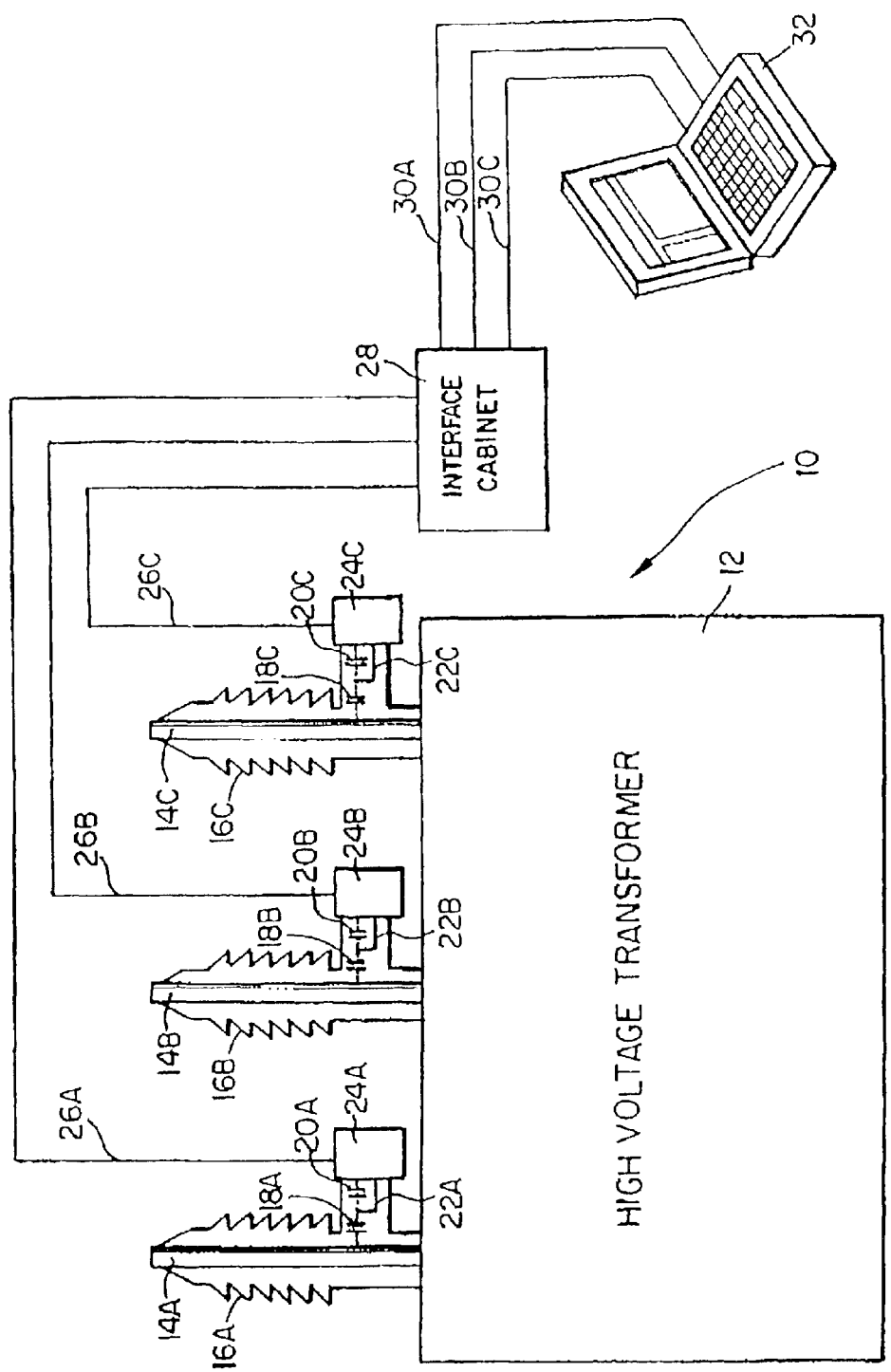

| | | | | |
|---|---|---|---|---|
| 4,801,937 A | * | 1/1989 | Fernandes | 340/870.16 |
| 5,303,164 A | * | 4/1994 | Masson et al. | 702/65 |
| 5,539,655 A | * | 7/1996 | Sato | 700/291 |
| 5,640,154 A | * | 6/1997 | Meyer et al. | 340/870.18 |
| 5,652,521 A | * | 7/1997 | Meyer | 324/551 |
| 6,028,430 A | * | 2/2000 | Frielingsdorf | 324/519 |
| 6,141,230 A | * | 10/2000 | Sum | 363/61 |
| 6,177,803 B1 | * | 1/2001 | Train et al. | 324/552 |
| 6,433,557 B1 | * | 8/2002 | Rashkes et al. | 324/551 |
| 2002/0074156 A1 | * | 6/2002 | Forster | 174/167 |
| 2002/0079903 A1 | * | 6/2002 | Smith et al. | 324/536 |
| 2002/0079906 A1 | * | 6/2002 | Rashkes et al. | 324/544 |
| 2004/0046531 A1 | * | 3/2004 | Ferraro et al. | 323/207 |

* cited by examiner

POWER FACTOR/TAN δ TESTING OF HIGH VOLTAGE BUSHINGS ON POWER TRANSFORMERS, CURRENT TRANSFORMERS, AND CIRCUIT BREAKERS

CROSS REFERENCE TO RELATED APPLICATION

Priority is claimed herein to U.S. Provisional Application No. 60/359,908, filed Feb. 27, 2002, which is incorporated by reference herein.

FIELD OF THE INVENTION

The present invention relates to a system for permitting the testing of power and current transformers and circuit breakers and other high voltage equipment while they are still on line at high voltage. More specifically, the present invention relates to a system for measurement of power factor (also known as the "dielectric loss angle" or "dissipation factor") to enable diagnosis of the condition of high power stand off insulators.

BACKGROUND

There are well established techniques for testing deterioration of high voltage (HV) equipment, and specifically the insulators of that equipment. Such methods involve first disconnecting the equipment from the HV line. The purpose of disconnecting the equipment is to avoid the substantial danger to personnel and/or testing equipment that is connected to high power equipment. In practice, it has been very expensive to disconnect equipment for testing. In addition to the man-power required to disconnect the HV equipment, connect it to test equipment and perform the test, the service of the equipment is lost for whatever period of time it takes to disconnect, make the test and reconnect. If there are large numbers of transformers and circuit breakers, and other equipment to be tested, the shut-down can be lengthy and the loss of revenue to the power company very substantial.

Testing the condition of insulation in HV equipment is an essential task. The insulation which is most subject to deterioration is contained within the HV standoff insulator and includes oilpaper insulation and a metallic foil or, alternatively, a conductive coating on the paper wrapped in a roll around the HV conductor at the center of the insulator. The insulating oil which surrounds the transformer, or other HV device, within the grounded metallic casing extends into contact with and saturates the oilpaper to improve its insulation properties. Deterioration usually occurs in the paper or metal foil or coating. Age and temperature contribute to such deterioration, particularly hot spots which may ultimately burn the paper. The actual time of deterioration can vary considerably and, therefore many power companies adopt a schedule of offline testing. The standard testing for insulator deterioration is widely known as Power Factor or Tan/δ testing to determine when power factor of an insulator has reached a dangerous condition and the insulation should be replaced. Normal aging of HV equipment is a slow process that can take place over 30 to 40 years due to thermal, electrical and environmental effects. Premature failure on the other hand is often a relatively sudden process that is not anticipated by periodic off-line tests. Failure to detect insulation deterioration can result in disastrous consequences, ultimately causing heating of the equipment, fire and explosion. Heat may generate various hydrocarbon gases from the oil used in the transformer and some of these gases, such as acetylene, are highly flammable and may be explosive. Pressure builds up and gases are eventually ignited when fire occurs or heating becomes extremely severe so as to initiate a spontaneous combustion. The resulting explosion shatters porcelain insulators and sends pieces flying, damaging adjacent equipment. In a substation, or other areas where multiple sets of equipment are employed, an explosion not only results in loss of the exploded device, but also may result in damage to other very expensive equipment, as well as posing substantial danger to personnel working in the area, or even to passers-by in some locations.

The eventual breakdown of insulation is a rapid avalanche of failing dielectric layers. Damaged or deteriorated dielectric is associated with the following: 1) Increased dielectric losses ($I^2R$) with other sources of heating may eventually fuel a mechanism of thermal runaway. PF is a measure of dielectric losses. 2) Partial discharges and treeing. High levels of partial discharge are reflected in the PF and are usually only present just after lightning or switching impulses and just before and during insulation failure. 3) Increased sensitivity to changes in temperature, humidity, and moisture (i.e., increased temperature coefficient). Sources of heating include dielectric losses, ambient temperature, and more significantly, load fluctuations. Most power companies are faced with the dilemma of taking equipment offline and testing it with consequent loss of revenue to the company, or, alternatively, leaving the equipment online without testing longer than it should be. The latter course allows damage to occur and take its toll. Therefore, there has existed for many years a need for a safe means of frequently periodically testing transformer and circuit-breaker bushing insulators without taking the equipment offline. The present invention is directed to such a means, which include a system and a process for testing the equipment and accumulating data about the condition of insulation without taking the equipment offline.

SUMMARY OF THE INVENTION

In accordance with the present invention, there is provided a test system, including a coupling means which provides a capacitive voltage divider to obtain a low potential signal proportionate to the HV across a bushing standoff insulator which can be continually measured. To provide a capacitive voltage divider, a tap to the conductor within the oilpaper insulator must be made intermediate to the HV conductor and ground. The conductor as mentioned may be a metal foil or a conductive coating on one side of the oilpaper insulator. Such a coating may be applied before the paper is oiled and be composed, for example, of particulate conductive material in a binder applied by painting or spraying onto one side of the paper before it is rolled up. If the conductor is a foil it may be a continuous wide strip rolled up with the paper. A tap conductively engaging the metallic layer near the grounded end remote from the HV terminal may be provided for various purposes. In some cases the tap is brought outside the bushing to a terminal supported on the outside of the bushing insulator. The tap's low voltage will be proportional to the HV and follow variations in the HV. If no terminal exists outside the bushing, one may be provided by passing a low voltage connection through the porcelain insulator of the bushing at its low voltage bottom end. A bushing tap coupler supported on the outside of the bushing connects to a conductive lead through the bushing to circuitry in the coupler and circuitry within the Interface Cabinet to provide the voltage divider and protection circuitry.

Electrically connected through the coupler to the reduced voltage tap and to the ground end of the insulator is a voltage reduction circuit in the Interface Cabinet which also completes the voltage divider. The voltage reduction circuit includes a series choke coil and parallel capacitors which feed a transformer which reduces the voltage at the secondary winding. Output leads from the secondary, across which may be provided capacitor and solid state bypass means, are connected to computer connection terminals.

Similar circuits are provided for input from each of the insulators in the equipment under test preferably in a single, grounded interface cabinet. For example, a three-phase system is provided with three similar circuits measuring outputs from the three different insulators of the same equipment. Alternatively, three separate insulators on single phase equipment can be connected to the three separate voltage reduction circuits. The interface cabinet is waterproof and permanently installed on or near the equipment subject to test so that it is always available for test.

A computer connects to a mating connector for each of the output leads of the voltage reduction circuits. The software provided is installed in a users PC and programmed to input through an analog to digital converter for each circuit to produce a digital signal which is then processed by a software program providing a Fourier analysis processor to obtain a power factor value. The power factor (PF) calculation in PF Live software is based on the conventional Schering Bridge. Data is acquired under software control from transducers connected to the test objects associated with a transformer and then the data is compared to data from another electrical phase to produce a power factor value. Each power factor reading for each insulator is coordinated with test data and equipment identification and location information. All this coordinated data can be stored on demand by the computer, in a preselected tabular form with power factor calculations from other insulators in the same equipment tested and identified placed in a common table, for example, and separate tables, or other related arrangements for keeping coordinated data on other equipment of the same sub-station. This calculation of a particular date of testing may be displayed, printed out together and/or stored so that the results may be compared from the same insulator from time-to-time based on relatively frequent checks of the system. A comparison table for each insulator showing dates of testing and power factor readings for each date can be compiled. Based on experience, it can be determined that when there are changes in the output amounting to a predetermined amount of change, it is time to disconnect a unit of equipment and proceed with the traditional offline full power factor check to be sure that the equipment is truly ready for insulator replacement. Meantime, however, the equipment has remained in service without interruption usually for years with consequent savings by avoiding large scale maintenance tests and loss of income from sales of power which otherwise have been unavailable to customers during shutdown.

A coupler is provided to a capacitive voltage divider including the effective low voltage capacitance load across the part of the conductive layers wrapped in insulating material connected to a tap at a low voltage point on the conductor wrapped within the insulator structure and providing an external connector to the tap coupler divider circuit. An external connection to the ground is also provided for the voltage divider. A voltage reduction circuit is connected to the external low voltage and ground output connections of the coupler. The voltage reduction circuit completes the voltage divider and further reduces the voltage in the voltage reduction circuit is to provide at the output terminals voltage levels suitable for connection to a computer and providing an output terminal for connecting to other components as desired. The computer is connectable to the output terminals of the voltage reduction circuit and contains software to convert a received analog signal to digital and subjecting the digital signal to a Fourier analysis to produce an output signal representative of power factor.

The invention also provides a method of measuring power factor of a bushing insulator of the type described above in high power (HP) electrical equipment. It first requires disconnecting high power from the equipment to initially install the coupler. Then the method requires providing a low voltage connection to a conductive capacitive layer at the low voltage end of the insulation roll around the HV center conductor in a bushing. This enables forming a capacitive voltage divider with a bushing tap coupler to provide voltage output from the coupler on the order of household voltage when HV is reconnected to the equipment. Then the method requires connecting the low voltage at the output of the coupler and voltage divider to a voltage reduction circuit to complete the voltage divider and produce a voltage level acceptable to a computer. Next, HV is reconnected to the equipment, so that the computer voltage is available on demand at the output to measurement equipment. Then a computer connectable to the further reduced voltage output of the voltage divider with a Fourier analysis program is provided for calculating power factor. The computer recalculates, processes and stores the bushing insulator power factor at periodic intervals.

The present invention also relates to a method of testing HV insulators for HV power equipment from which a low voltage output has been provided across a capacitive voltage divider from a tap to a conductive capacitive layer at the low voltage end of the insulation roll around a HV center conductor in a bushing and is made accessible through a bushing tap coupler. A voltage reduction circuit to reduce the voltage is then connected across the low voltage obtained from the voltage divider to achieve a level acceptable to a computer. A computer is provided with programming to provide a suitable input signal to a Fourier analysis program to obtain the power factor of the insulator. The computer is connected to the voltage reduction circuit to obtain a reading of power factor of that insulator to store in memory with an indication of date and place and with identification of the specific insulator on the specific equipment tested.

BRIEF DESCRIPTION OF THE INVENTION

Figure 2:
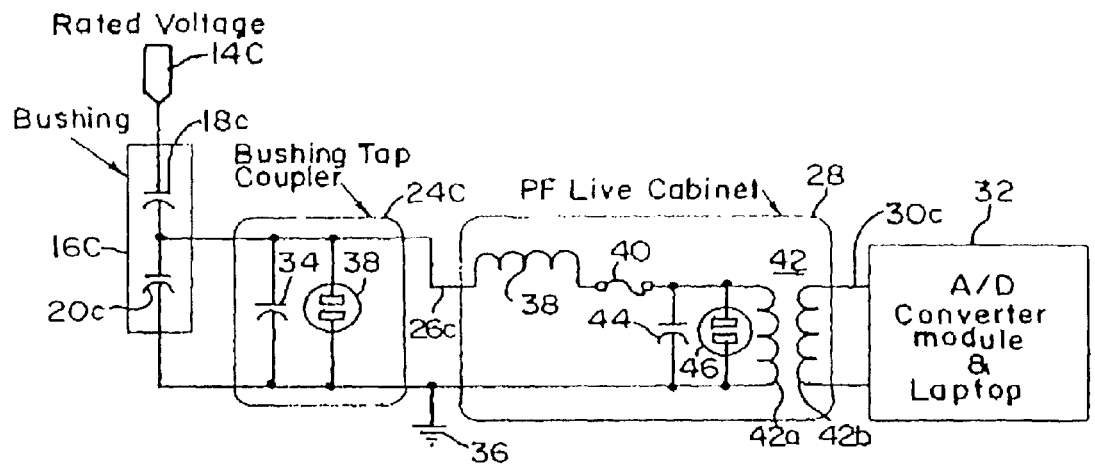
Figure 3:
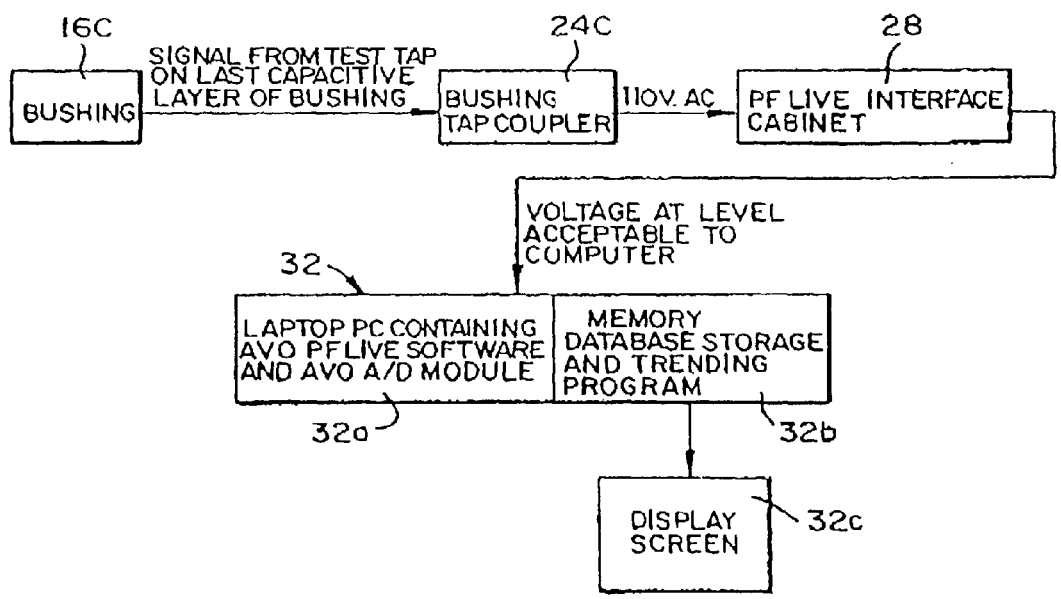

For a better understanding of the present invention reference is made to the accompanying drawings in which, FIG. 1 is a schematic diagram showing components of a system in accordance with the present invention;

FIG. 2 is a schematic circuit diagram of the system in accordance with the present invention, and FIG. 3 is a block diagram showing the system from a component and function standpoint.

DETAILED DESCRIPTION OF THE INVENTION

FIG. 1 shows very schematically a HV transformer generally designated 10. The transformer itself is enclosed in a casing 12 which is preferably metal or other conductive material that can be grounded. The HV transformer windings and core are contained within the casing insulated from the casing by appropriate supports and by oil which may be mineral oil or processed oil improving its insulating properties. The voltage is sufficiently high that considerable attention must be given to bringing its HV conductors out of the transformer casing 12. The transformer represented here has three HV outlets shown which may represent three phases of alternating the current which are commonly kept together and are common in the transformer housing. There is a HV rod connector 14A, 14B, and 14C for the respective phases. Each of these HV conductors is spaced away from the transformer casing 12 by providing an opening sufficiently larger than the respective rod conductors 14A, 14B, and 14C to avoid any possibility of arcing. Additionally, each of the conductors is provided with a hollow standoff insulator 16A, 16B, and 16C which is composed of insulation material such as porcelain which is normally glazed on its outer surface, or less likely, glass or ceramic. The insulators are generally cylindrical or slightly conical or frusto-conical in shape and are commonly characterized by having successive rings of corrugation extending totally around the insulator in each case and extending successively further and further from the transformer housing 12. Each insulator embraces the rod conductor 14A, 14B, and 14C except for their contact at the outer end. The bushing insulators are spaced from the central rod conductors so that there is a hollow inner space between the insulator and the conductor except at its outer end furthest from the casing 12. Insulating oil is commonly brought up to a high level within the standoff insulators and between the interior surfaces of the insulators and the central HV conductor is provided with a roll of insulating material. This material is commonly a kraft paper which is rolled about the central conductor. It is common to roll within the paper a roll of foil or alternatively to spray coat the paper before it is rolled with a coating of metallic particles which make contact with one another and perform electrically like a continuous conductive metallic sheet. The roll of paper and conductor are immersed in the insulating oil. When the transformer is in operation, and HV is applied to the center conductor, the rolled conductor within the insulator provides a gradient reduction in voltage between the HV conductor and the inner side of the insulator. Bushing taps may be connected to the foil at different places between the insulator shell and the HV conductor by tap connected to the conductor.

In accordance with the present invention, a low voltage is taken off a bushing tap. That voltage may advantageously be on the order of household voltage 110 volts ac. In FIG. 1 the bushing capacitance is represented by pairs of capacitors 18A and 20A, 18B and 20B, 18C and 20C with the bushing tap connector 22C between them. The tap providing the low voltage is taken out through an opening in the insulator through tap couplers 24A, 24B, and 24C. Each of the tap couplers has an output lead 26A, 26B, and 26C to an interface cabinet 28. The interface cabinet further provides voltage reduction and surge protection to an output connector from the interface cabinet 28 to a quick connector for lines 30A, 30B, and 30C connected to a laptop computer 32.

FIG. 2 shows a schematic circuit of a single representative connection between bushing and laptop computer for one phase, phase C, being understood that there is a similar circuit for each of the other two phases. FIG. 2 shows the bushing 16C with its high rated voltage conductor 14C extending out of the bushing. The tap 22C is shown between capacitors 18c and 20c. 18c represents the bulk of the paper and metal rolled up to the part of the layer of metal to which tap 22c is attached. The balance of the metal in the roll from there to the inside of the insulator 16c is relatively small so that acting as a voltage divider the voltage taken off at tap 22c may be selected to produce approximately 110 volts of household voltage. The bushing coupler 24C provides further capacitance 34 across the voltage from the tap 22c and ground. The bushing insulator 16C is nominally at ground, but is connected to ground 36 in the bushing tap coupler 24C beyond the spark gap 38 across the tap potential and the ground wire connection. The spark gap 38 is intended to give protection against surges or other transient effects that might be damaging to the system.

The output from the bushing tap coupler 24C as previously mentioned is an output from connector 26c providing approximately 110 volts or some other selected voltage in that approximate range. That voltage is fed into the PF Live interface cabinet 28 through a choke coil 38 and a fuse 40 to the primary 42 a which has a capacitor 44, and probably multiple capacitors, across its input. It also has a spark gap 46 across its input. The interface cabinet 28 is primarily provided to reduce the voltage to one suitable input to a laptop computer 32 and that voltage is output across the secondary 42b on input lead 30c and an Analog ground connection. Preferably quick connectors are provided which allow the laptop or other computer to be quickly plugged in on site, of course, with no interruption of power. The quick connect plug may include connectors for all three phases. The computer 32 is advantageously a laptop for portability and requires an analog to digital converter module and an analysis program based on a Fast Fourier transform algorithm, as described below, for deriving the power factor from the signals input from each of the phases.

FIG. 3 represents the bushing and its contents as described above. It takes a signal from the test tap on the last capacitive layer of the bushing which is fed into the bushing tap coupler 24c to produce a voltage output nominally at 110 volts AC. PF Live interface in cabinet 28 provides voltage at a level acceptable to computers, 5 volts in actual practice, and is fed to the laptop computer 32. All three phases of the transformer schematically illustrated in FIG. 1 may be connected simultaneously to the computer and the signals processed sequentially.

While the voltage acceptable to computers is relatively low, the invention might have applications for higher voltage. There are a number of international standards for what is a safe voltage level, and there may be various applications of the invention requiring voltage higher than 5 volts. Any such useful voltage is intended to be included as possible, provided it is safe to the user. Such voltage is defined in IEG 61010-1 (Second Edition 2001–02), published as a "Group Safety Publication" by IEC as the International Standard. In paragraph 6.3, Permissible Limits for Accessible Parts, and its subparagraphs 6.3.1, Values in Normal Condition, and 6.3.3, Values in Single Fault Condition, give boundaries to safe voltages.

The power factor (PF) measurement is based on the derivation of the phase shift between two voltage signals. For signals consisting of sequences of samples $x_i$ and $y_i$ the phase angle is preferably determined by first utilizing a Fast Fourier Transform formula to obtain sine and cosine components of the the signals as follows:

$$a = \sum_{i=1}^{n} \cos\left(\frac{2\pi i}{n}\right) \times x_i$$

$$b = \sum_{i=1}^{n} \sin\left(\frac{2\pi i}{n}\right) \times x_i$$

where a is the cosine component of signal $x_i$, b is the sine component of signal $x_i$, and n is the number of samples per channel utilized for each measurement. After having obtained sine and cosine components $(a_x, b_x), (a_y, b_y)$ for the respective x and y channels, $\tan(\delta)$ is determined as:

$$\tan(\delta) = \frac{a_y b_x - a_x b_y}{a_x a_y + b_x b_y}$$

The value of $\delta$ thus obtained is preferably corrected for error induced by sampling by subtracting $(2\pi[\text{system frequency}]/[\text{sampling rate}])$. The relative power factor is then given as $PF = \cos((\pi/2) - \delta)$.

The measurement of PF of insulation is accepted as part of well-established laboratory testing procedures to determine the quality of insulation at the factory before commissioning new and refurbished HV equipment. PF as a parameter is by nature a relatively slow-changing value and is an integral characteristic depending on: 1) Design, materials and production technology; 2) Operating voltages and temperatures; 3) Aging of insulation related to design and operating conditions such as over-voltages, loading conditions, etc.; and 4) Climatic/Weather related Phenomenon.

The system calculates the PF of a unit as a relative value compared with a reference voltage from another device that is in service, thereby eliminating the need for a standard capacitor. The reference device does not have to be associated with the same phase since the system of the present invention is configured to automatically make the proper phase angle adjustments. Relative measurements and evaluation can reduce the affect of influences such as ambient temperature, operating voltages, loading conditions, different aging characteristics, different designs, operating conditions, etc.

The software permits entering the nameplate PF values for each sample under test. Using this value, the PF is normalized to a PF result, which is comparable to an off-line test value.

An output stored in a memory database which identifies each piece of apparatus in each substation or other installation having insulators checked, specifically identifies specific insulators of each piece of equipment and the test results at a particular date of testing. It is also advantageous to provide a trending program developed for analyzing the readings of a particular type of insulator over time and based upon experience determining when that insulator is becoming sufficiently doubtful because of its change in calculated power factor to justify full testing, i.e., removing the equipment from HV and checking the insulator with more precise equipment known in the art. The data is stored in memory including the calculated power factors (PF) for each insulator together with dates of tests may be displayed on the screen of the laptop or the laptop may be plugged into a larger screen for better facilities for viewing. The results of course can be displayed, printed out or handled in other conventional ways that data is accessed from computers.

The PF Live software in its present form executes on a notebook computer, having the following components: Windows 95, 98, Me, NT4 or 2000, Pentium II 233 MHz processor, CD Rom Drive, 64 MB RAM, 50 MB Hard drive space available for data storage, and 1 available Class 1 PCMCIA slot. Modified software may be used or computers having somewhat different capabilities.

We claim:

1. A low voltage system for measurement of power factor to enable diagnosis of the condition of high power stand off insulators which include a roll of insulating material around a central HV conductor in a hollow rigid insulator body in a power system while the power system is in use and subject to full voltage, comprising:

coupling means providing a capacitive voltage divider with a tap near the lowest voltage point on the conductor wrapped within the insulator structure, a ground connector and an external lower voltage connector proximate to the insulator surface;

an intermediate voltage reduction circuit connected and spanning space between the lower voltage connector and an output terminal which carries voltage reduced to a computer compatible level, which output terminal is fixed in position spaced sufficiently far from the insulator and other high voltage associated parts to assure no danger to testing personnel taking measurements, which voltage reduction circuit is connected to the external connector of the coupling means for that one insulator and left attached to the external connector for use upon demand without disconnecting the tested equipment from service level HV;

portable computer means connectable to the output terminal of the voltage reduction circuit and containing software to convert a received analog signal to digital and subjecting the digital signal to an AST Fourier transform analysis to produce an output signal representative of power factor.

2. The system of claim 1 in which there are a plurality of coupling means providing external connections for different insulators under test and a plurality of voltage reduction circuits, one connected to each of the external connectors, are left connected to respective external connectors of the respective insulators, the output terminal of each of which voltage reduction circuits may be connected to computer means for separate processing and collection of data specific to each of their respective high power insulators.

3. The system of claim 2 in which at least portions of the voltage reduction circuits including at its output terminals are housed and labeled at a common fixed point and have individual output terminals for each circuit for cooperating with a computer input permitting separate sequential testing of each individual insulator by the same computer.

4. A method of installing and safely using a permanent low voltage reduction circuit for measuring power factor of a bushing insulator in high power electrical equipment, comprising disconnecting high HV power from the equipment, using a low voltage connection to a conductive capacitive layer at the low voltage end of a conductive layer in an insulation roll in a bushing and terminating in a connector accessible from outside the bushing for connection to provide a capacitive voltage divider with a bushing tap coupler which will provide a lower voltage output from the coupler on the order of household voltage when HV is reconnected to the equipment, connecting the low voltage from the coupler to a further voltage divider circuit unit to be left connected to further reduce the lower voltage at the output of the voltage divider circuit to a level acceptable to a computer and including fixed housing for at least an output terminal of the further voltage divider circuit which provides a computer access to the output terminal location sufficiently far from the bushing and from other HV equipment and parts in the area to be safe for access by personnel taking measurements at the output terminal, reconnecting high power to the equipment, so that the computer voltage is available on demand at the output to measurement equipment, providing a portable computer with Fourier analysis program for calculating power factor, and connectable to the terminal output of the further voltage divider to provide the further reduced voltage output of the voltage divider to the computer, and connecting such a computer to the computer terminal to calculate, process and store the bushing insulator power factor of an identifiable insulator at identifiable times at periodic intervals without disconnecting high power from the equipment.

5. The method of claim 4 performed on equipment with three separate HV insulators using separate low voltage taps and dividers connected to low voltage taps on capacitive conductors at the low voltage end insulation rolls in the respective insulators and separate bushing tap couplers to provided separate voltage dividers with outputs connected to separate low voltage dividers having remote output terminals in a common fixed housing to provide computer level voltage outputs connectable to a common computer for sequential generation of power factor of each insulator.

6. A method of testing of individual HV insulators for HV power equipment from which a low voltage output has been provided across a capacitive voltage divider from a tap to a conductive capacitive layer at the low voltage end of the insulation roll in a bushing and is made accessible through a bushing tap coupler, comprising connecting the bushing tap coupler for a long term to a voltage reduction circuit to reduce the voltage to a level acceptable to a computer at a fixed terminal sufficiently remote from the bushing under test and other HV equipment or parts to be safe for use by testing personnel, providing a computer with programming to provide a suitable input signal to a Fourier analysis program to obtain the power factor of the insulator and temporarily connecting the computer to the voltage reduction circuit as frequently as desired to obtain a reading of power factor and storing each reading in memory with its test date and with identification of the specific insulator on the specific equipment tested.

7. The method of claim 6 in which tests are performed on multiple insulators and information is collected in memory by the computer for related equipment.

8. The method of claim 7 in which periodically over time tests are made and collected in memory together so as to be readily comparable and such tests may be compared and changes in power factor noted so that when deviation of power factor amounts are sufficiently significant further more comprehensive tests may be made.

9. A method of testing insulating material in high voltage apparatus, comprising the steps of:

providing a portable computer;

connecting a tap forming a bridge circuit with the insulating material;

digitizing an output signal obtained from the bridge circuit to obtain a digital signal;

using the portable computer to perform a fast Fourier transform analysis of the digital signal at an operating frequency to obtain angular components of the digital signal;

comparing the angular components of the digital signal with angular components of a reference signal to calculate a dissipation factor of the insulating material.

10. The method of claim 9 comprising the step of storing the dissipation factor in a database of dissipation factors obtained from the high voltage apparatus over a period of time.

* * * * *